United States Patent [19]

Okamura et al.

[11] Patent Number: 4,586,056
[45] Date of Patent: Apr. 29, 1986

[54] THERMAL HEAD

[75] Inventors: Yasushi Okamura; Kiichirou Tanaka; Hideo Fujino, all of Fukuoka, Japan

[73] Assignee: Matsushita Electric Industrial Co., Inc., Kadoma, Japan

[21] Appl. No.: 630,528

[22] Filed: Jul. 13, 1984

[30] Foreign Application Priority Data

Jul. 15, 1983 [JP] Japan ................. 58-129734

[51] Int. Cl.⁴ ............................................. G05D 15/06
[52] U.S. Cl. ................. 346/76 PH; 219/543; 346/139 C; 400/120; 338/309
[58] Field of Search .............. 346/76 PH, 76 R, 155, 346/139 C, 199 C; 219/216, 216 PH, 543; 400/120; 338/308, 309; 358/295; 256/3, 8; 340/786

[56] References Cited

U.S. PATENT DOCUMENTS 4,217,480 8/1980 Livermore et al. ................. 319/543
4,224,565 9/1980 Sosniak et al. ........................ 338/35
4,287,525 9/1981 Tagawa ............................... 346/155

Primary Examiner—E. A. Goldberg
Assistant Examiner—A. Evans
Attorney, Agent, or Firm—Cushman, Darby & Cushman

[57] ABSTRACT

A thermal ceramic head chip (1) having plural heating elements (2) and a connecting portion (5) and held on a head base (10) and a folded flexible printed circuit sheet (3) having an external lead portion (4) on its outside face, the wiring conductors on the flexible printed circuit sheet (3) is connected to the connecting portion (5). At the former's connecting opening disposed on the inside face of the former, and the flexible printed circuit sheet (3) with a dew sensor gap (13) for electrical detection of dew if any.

13 Claims, 5 Drawing Figures

FIG. 2(a)
FIG. 2(b)
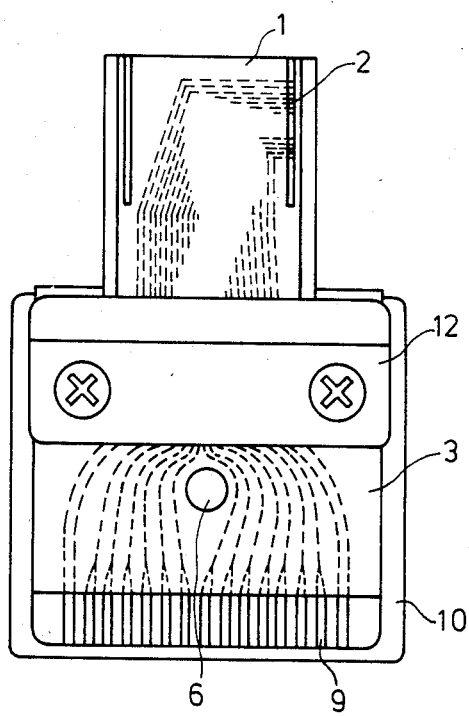
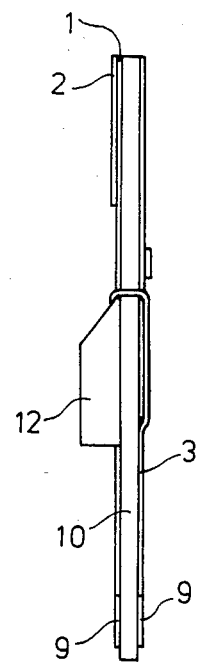

FIG. 3(a)
FIG 3(b)
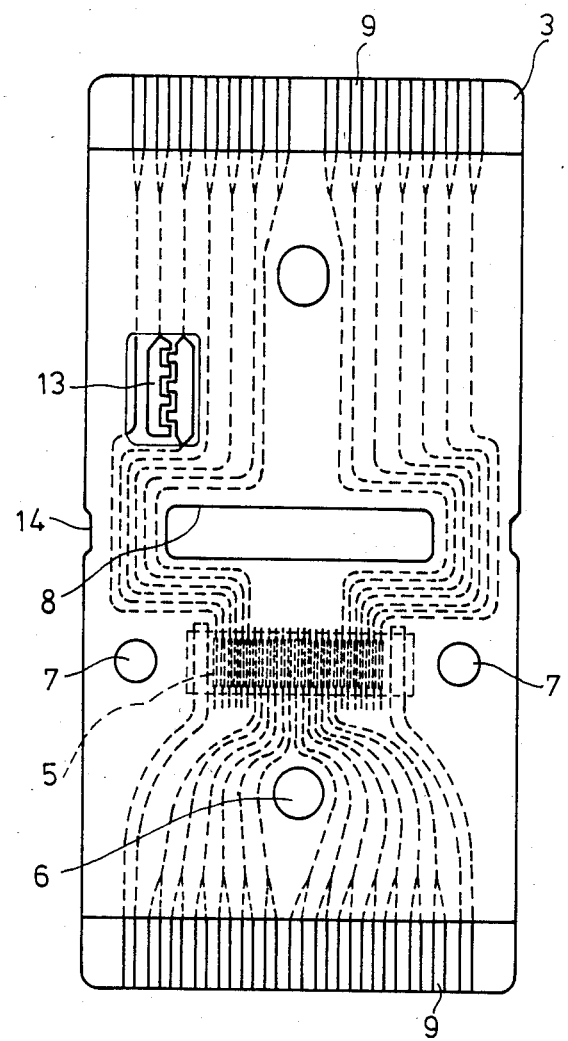
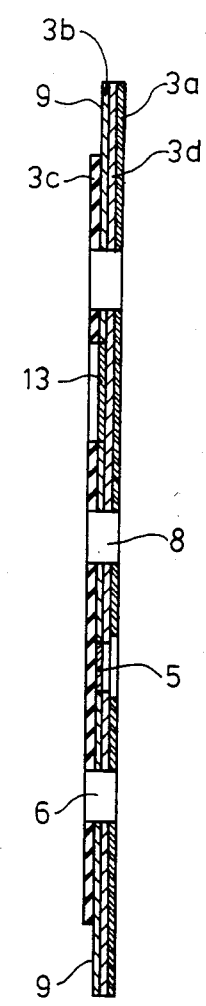

THERMAL HEAD

BACKGROUND OF THE INVENTION

1. Field of the Invention

The present invention relates to a thermal head assembly for use in a thermal printer.

2. Description of the Prior Art

A thermal head used in a printer has a large number of resistance heating elements in a line. These resistance elements are elements with small resistors adapted to be heated by current and thus to produce high temperature by joule heats. These are located on a insulated substrate, generate color pattern on a thermosensitive paper which is driven to touch the resistance heating elements. A printing of a character or pattern is made as dot matrix. The larger the number of dots the higher the quality of print is. Accordingly, recent dot printers have a dot matrix of 24 dots×24 dots rather than a matrix of 8 dots×8 dots. In order to make such a dot matrix of 24 dots×24 dots, the twenty-four heating elements must be disposed in a line, and twenty-five signal lines, one to each heating element and one common line inclusive are needed. Conventionally, a connecting means with twenty-six terminals is connected to the substrate on which the heating elements are disposed. However, the connection between the connecting means and the heating elements has been a troublesome task. Sometimes short-circuit can occur between the signal lines due to high humidity, and therefore, contrast of the printed pattern is likely to be low.

SUMMARY OF THE INVENTION

The purpose of the present invention is to provide an improved thermal head, which is simple in assembling.

Another purpose of the present invention is to provide a thermal head which has good resistivity against humidity and hence has a long life of service.

Still another purpose of the present invention is to provide a thermal head having means to detect dewing if it takes place in the wiring conductors.

The thermal head in accordance with the present invention has:

a head chip with a first connecting portion, a number of heating elements fixed on the head chip, a head base for holding the head chip, a folded flexible printed circuit sheet having a second connecting portion disposed on an inside face of the folded flexible printed circuit sheet for connection to the first connecting portion. External connecting terminals are also disposed on an outside face of the folded flexible printed sheet.

BRIEF DESCRIPTION OF THE DRAWINGS

FIG. 2(a) is an assembled front view of the thermal head of the embodiment;

FIG. 2(b) is an assembled side view of the thermal head of the embodiment;

FIG. 3(a) is an extended view of flexible printed circuit sheet; and

FIG. 3(b) is a cross-sectional side view of the extended flexible printed circuit sheet.

DETAILED DESCRIPTION OF THE PREFERRED EMBODIMENTS

Figure 1:
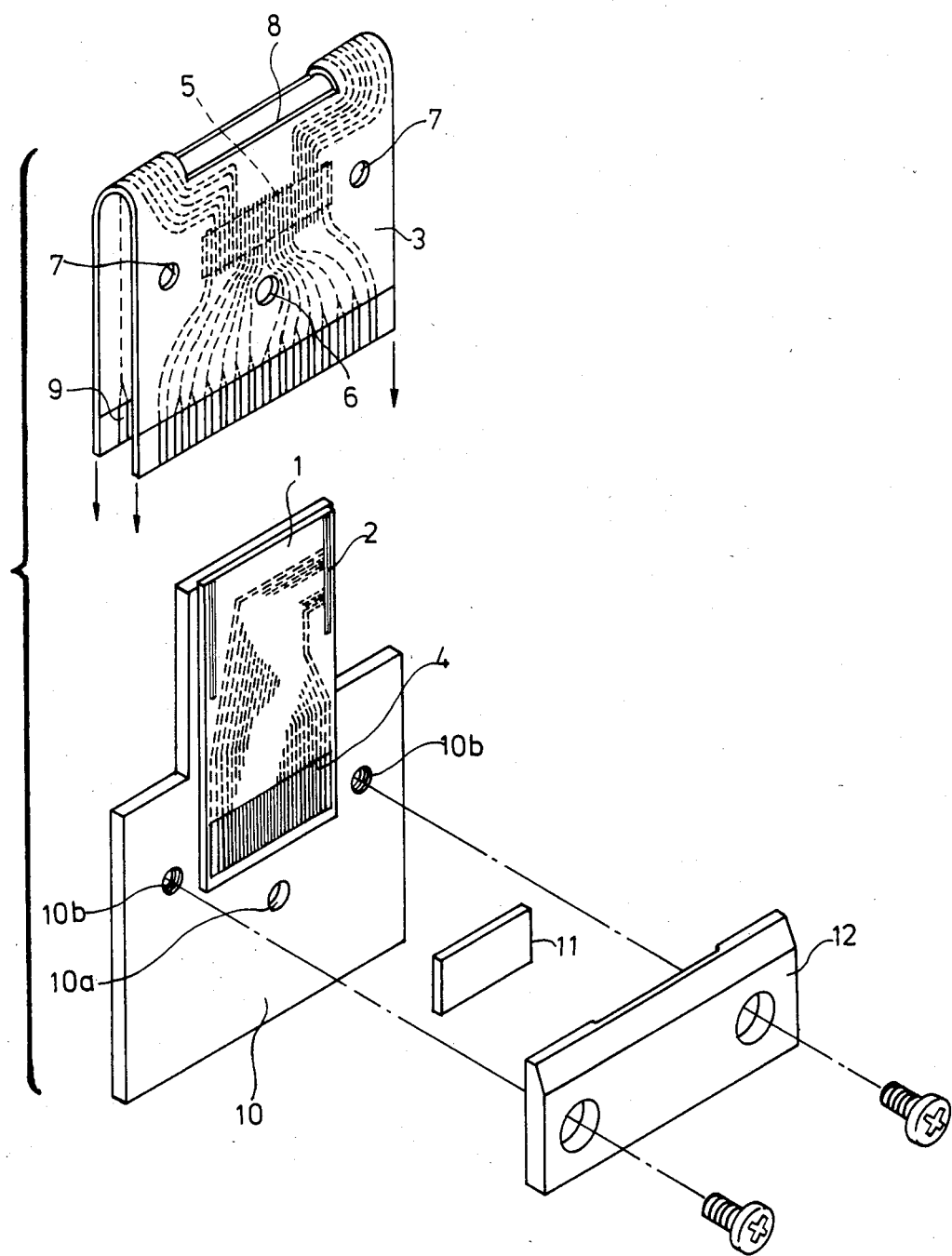
FIG. 1 is a perspective view showing assembly of a thermal head embodying the present invention.

In FIG. 1, twenty-four thin film type resistance heater elements 2, which are formed by using known photo-etching process, are provided on a head chip 1. A flexible printed circuit sheet 3 has a connecting portion 5 formed by exposing the wiring conductor in an opening. The connecting portion is to be connected to a lead portion 4 of the head chip 1 when assembled. The flexible printed circuit sheet 3 contains (as shown in FIGS. 3(a) and (b), a substrate 3d, a printed conductor part 3b and an insulator layer 3c thereon. Bond layer 3a is formed by painting a bonding paste 3a on the outside surface of the substrate 3d except the part of the holes 6, 7 and 8 and connecting portion 5 (the area surrounded by a dotted line in FIG. 3). Outside terminals 9 which are to be connected to the lead portion 4 through a connecting portion 5 are distributed at both end parts of the flexible printed circuit sheet 3. In FIG. 1, the flexible printed circuit sheet 3 is folded, and fixed and mounted on a head base 10. Hence, it is connected to the head chip 1 by the connecting portion 5. Head base 10 is made of a heat conductive material such as aluminum, in order to aid improved heat radiation of the resistance heater element 2.

A guide hole 10a is disposed on the head base 10. When the flexible printed circuit sheet 3 is folded and assembled to the head base 10 in accurate position, the connecting portion 5 of the flexible printed circuit sheet is placed on the lead portion 4. This can be done, for example, by locating a guide pin (not shown) inserted through the guide hole 10a and a hole 6 of the flexible printed circuit sheet. An elastic member 11 (for example, silicon rubber) is provided on the backside of the connecting portion to assure stable contact of lead portion 4 and the connecting portion. Then, a clamping member 12 is fixed by securing with two screws in the screw holes 10b to the head base 10. Furthermore, the elastic member 11 serves to protect the connecting portion 5 from outside shock. A dew sensor 13 consisting of two comb shape conductive islands is provided on the flexible printed circuit sheet 3. Two indent parts 14 of the flexible printed circuit sheet 3 are provided for easy bending. An opening 8 is a hole for inserting the head chip 1 therethrough. As shown in FIG. 1, the flexible printed circuit sheet is bended after folded in U-shape at the parts between two indent parts 4. Head chip 1 is inserted in the opening 8 of the flexible printed circuit sheet. As shown in FIG. 2(b), the flexible printed circuit sheet 3 can be accurately located on the head base 10 by the locating means, for instance, the guide hole 10a and the hole 6. The flexible printed circuit sheet 3 is bonded to the head base 10 by the bond layer 3d which is painted on the flexible printed circuit sheet 3. Because the head chip 1 is bonded accurately at a predetermined position of the head base 10, the connecting portion 5 of the flexible printed circuit sheet is located accurately to the lead portion 4 of the head chip 1. Furthermore, the bonded connecting portion 5 and lead portion 4 are shielded from an outside air influence by the bonding layer 3d. Therefore, the connecting means between the connecting portion 5 and the lead portion 4 is protected from corrosion. When the flexible printed circuit sheet gets wet from dew condensation and two comb shape conductive islands are short-circuited by the drop of dew, and a short-circuit signal which indicate dew wetting is issued through the terminals 9.

What is claimed is:

1. A thermal head assembly comprising:
   a head base having a shape of wider under part and a narrow upper part;
   a head chip located on said upper part of said head base having a first connecting portion;
   a plurality of heating elements fixed on said head chip;
   a folded flexible printed circuit sheet having a second connecting portion disposed on an inside face of said folded flexible printed circuit sheet for connection to said first connecting portion, said printed sheet having an aperture for insertion of said narrow upper part of said head base therethrough; and
   external connecting terminals disposed on an outside face of said folded flexible printed sheet.

2. A thermal head in accordance with claim 1, which further comprises:
   a dew sensor having a pair of comb shape conductors disposed opposing one another to make narrow zigzag gaps between teeth of both combs on said flexible printed circuit sheet.

3. A thermal head in accordance with claim 1, further comprising
   clamping means and an elastic member for connecting said first connecting portion to said second connecting portion by pressing with said clamping means through said elastic member.

4. A thermal head in accordance with claim 1, wherein
   bonding means cause the bonding of said flexible printed circuit sheet to surfaces of said head base, said first and second connecting portions being free of said bonding means for direct electrical connection therebetween.

5. A thermal head comprising:
   a head chip having a first connecting portion,
   a plurality of heating elements fixed on said head chip,
   a head base for holding said head chip and having a shape of wider under part and narrow part,
   said heating elements being disposed on said upper part,
   a folded flexible printed circuit sheet having a second connecting portion disposed on an inside face of said folded flexible printed circuit sheet for connection to said first connecting portion,
   said folded flexible printed circuit sheet being bonded to both surfaces of said head base and having an aperture for insertion of said narrow upper part of said head base therethrough, and
   external connecting terminals disposed on an outside face of said folded flexible printed sheet.

6. A thermal head in accordance with claim 5, which further comprises:
   a dew sensor having a pair of comb shape conductors disposed opposing to make narrow zigzag gaps between teeth of both combs on said flexible printed circuit sheet.

7. A thermal head in accordance with claim 5, further comprising
   clamping means and an elastic member for connecting said first connecting portion to said second connecting portion by pressing with said clamping means through said elastic member.

8. A thermal head in accordance with claim 5, wherein
   bonding means causes the bonding of said flexible printed circuit sheet to both surfaces of said head base, said first and second connecting portions being free of said bonding means for direct electrical connection therebetween.

9. A thermal head assembly comprising:
   a head base, including an upper part and a lower part, said upper part being of a narrower width than said lower part, comprising:
   (a) a head chip residing on said upper part and at least part of said lower part;
   (b) a plurality of heating elements located on an upper portion of said head chip; and
   (c) first connector means located on said head chip for connecting to a mating connector; and
   a printed circuit sheet of a generally "U" shape and containing a slot through which said upper part of said head base is designed to protrude, comprising:
   (a) second connector means for mating with said first connector means of said head base; and
   (b) a plurality of external terminal means for electrically connecting to said thermal head assembly.

10. A device as in claim 9 wherein said head base and said printed circuit sheet each have at least one hole, and further including:
    clamping means for securely fastening said head base to said printed circuit sheet through said holes.

11. A device as in claim 10 further comprising means for detecting excess humidity and producing a signal indicative thereof.

12. A device as in claim 1 wherein said printed circuit sheet is connected to said head base.

13. A device as in claim 12 wherein said printed circuit sheet covers said head base on both surfaces of said head base.

* * * * *